(12) United States Patent
Lin

(10) Patent No.: US 7,085,136 B2
(45) Date of Patent: Aug. 1, 2006

(54) HEAT DUCT-EQUIPPED HEAT-RADIATING DEVICE FOR POWER SUPPLY

(75) Inventor: Pei-Shi Lin, Taipei Hsien (TW)

(73) Assignee: Thermaltake Technology Ltd., Taipei Hsien (TW)

( * ) Notice: Subject to any disclaimer, the term of this patent is extended or adjusted under 35 U.S.C. 154(b) by 182 days.

(21) Appl. No.: 10/823,762

(22) Filed: Apr. 14, 2004

(65) Prior Publication Data

US 2005/0231917 A1    Oct. 20, 2005

(51) Int. Cl.
*H05K 7/20* (2006.01)
*F28F 13/00* (2006.01)

(52) U.S. Cl. ............... 361/712; 361/697; 165/135
(58) Field of Classification Search ........ 361/712–714, 361/704, 707, 687, 688, 697, 702, 703, 709; 165/135

See application file for complete search history.

(56) References Cited

U.S. PATENT DOCUMENTS

| 5,842,514 | A  | * | 12/1998 | Zapach et al. | ......... | 165/104.33 |
| 6,087,800 | A  | * | 7/2000  | Becker et al. | ............... | 318/778 |
| 6,292,363 | B1 | * | 9/2001  | Shinohara et al. | .......... | 361/695 |
| 6,411,514 | B1 | * | 6/2002  | Hussaini | ..................... | 361/704 |
| 6,856,503 | B1 | * | 2/2005  | Apfelbacher et al. | ....... | 361/676 |
| 6,903,936 | B1 | * | 6/2005  | Lin | ............................ | 361/752 |
| 6,927,980 | B1 | * | 8/2005  | Fukuda et al. | .............. | 361/700 |

* cited by examiner

*Primary Examiner*—Randy W. Gibson
*Assistant Examiner*—Hung Nguyen
(74) *Attorney, Agent, or Firm*—Rosenberg, Klein & Lee

(57) ABSTRACT

A heat duct-equipped heat-radiating device for power supply, including: a heat conductive board tightly attached to a heat source of the power supply; a heat duct tightly bridged over the heat conductive board, one end of the heat duct outward protruding from the housing of the power supply; and a fin body fixedly mounted on outer side of the housing of the power supply. The fins of the fin body are respectively formed with corresponding fitting holes through which the heat duct is fitted to contact with the fins. Accordingly, the heat generated by the heat source of the power supply is quickly conducted through the heat duct to the fin body on outer side of the housing and dissipated from the fin body to outer side.

7 Claims, 5 Drawing Sheets

HEAT DUCT-EQUIPPED HEAT-RADIATING DEVICE FOR POWER SUPPLY

BACKGROUND OF THE INVENTION

1. Field of the Invention

The present invention is related to a heat duct-equipped heat-radiating device for power supply, and more particularly to a heat-radiating device in which the heat generated by the heat source in the housing of the power supply is quickly conducted through the heat duct to the fin body on outer side of the housing and quickly dissipated to outer side.

2. Description of the Prior Art

An existent desktop computer mainframe contains a motherboard, CD-ROM, interface card, etc. In addition, a power supply is mounted in the housing of the mainframe to supply power for the respective electronic elements or units.

In order to supply sufficient power for more and more electronic elements contained in the computer mainframe, the power of the power supply is relatively higher and higher. After a period of use of the computer mainframe, the internal circuit chip module tends to generate high heat due to magnetic induction. In case the heat is not properly radiated, the semiconductor inside the power supply is extremely easy to damage due to overheating. Accordingly, as shown in FIG. 5, one or more heat-radiating fans 92 are mounted on outer side of the housing of the power supply 91 for sucking out the hot air from the interior of the power supply 91. However, the heat generated by the heat source of the power supply 91 cannot be directly radiated. Simply the hot air in the housing of the power supply 91 is sucked out. Therefore, the heat-radiating efficiency of the heat source itself is very poor. As a result, although there are heat-radiating fans 92 arranged on outer side of the housing of the power supply 91, the internal electronic elements still often damage due to too high temperature.

SUMMARY OF THE INVENTION

It is therefore a primary object of the present invention to provide a heat duct-equipped heat-radiating device for power supply, including: a heat conductive board fixedly connected in a housing of the power supply and tightly attached to a heat source of the power supply; a heat duct tightly bridged over the heat conductive board, one end of the heat duct outward protruding from the housing of the power supply; and a fin body composed of multiple fins, the fin body being fixedly mounted on outer side of the housing of the power supply, the fins of the fin body being respectively formed with corresponding fitting holes through which the heat duct is fitted to contact with the fins, whereby the heat generated by the heat source of the power supply is quickly conducted through the heat duct to the fin body on outer side of the housing and dissipated from the fin body to outer side.

The present invention can be best understood through the following description and accompanying drawings wherein:

DETAILED DESCRIPTION OF THE PREFERRED EMBODIMENTS

Figure 1:
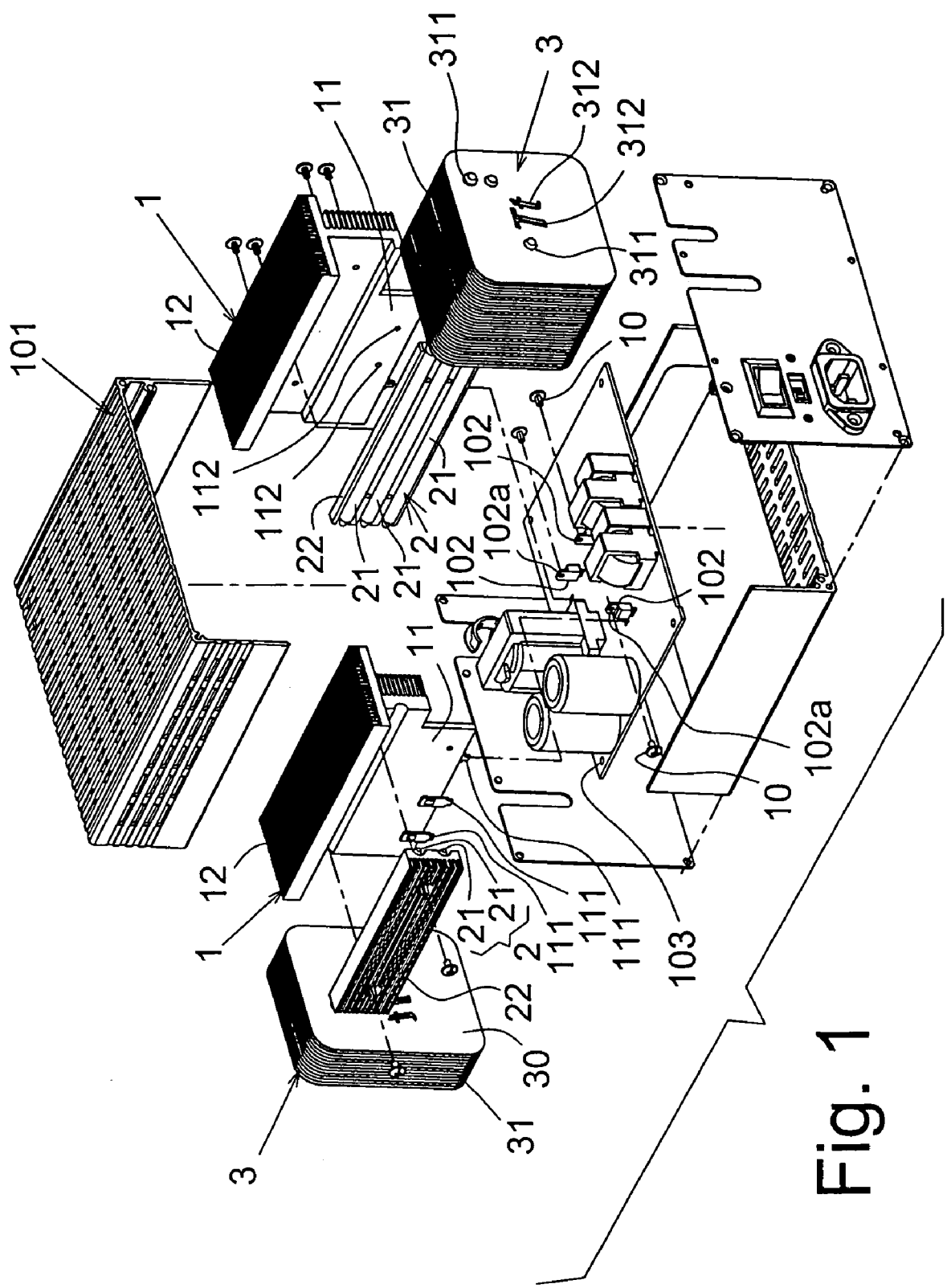
FIG. 1 is a perspective exploded view of the present invention.

Please refer to FIGS. 1 to 4. The heat duct-equipped heat-radiating device for power supply of the present invention includes a heat conductive board 1 fixedly connected in a housing 101 of the power supply. The heat conductive board 1 is tightly attached to the heat source 102 of the power supply. The heat-radiating device further includes a heat duct 2 tightly bridged over the heat conductive board 1. One end of the heat duct 2 outward protrudes from the housing 101 of the power supply. The heat-radiating device further includes a fin body 3 composed of multiple fins 31. The fin body 3 is mounted on outer side of the housing 101 of the power supply. The fins 31 of the fin body 3 are respectively formed with corresponding fitting holes 311 through which the heat duct 2 is fitted to contact with the fins 31. Accordingly, the heat generated by the heat source 102 of the power supply is quickly conducted through the heat duct 2 to the fin body 3 on outer side of the housing 101 and dissipated from the fin body 3 to the environment.

Figure 2:
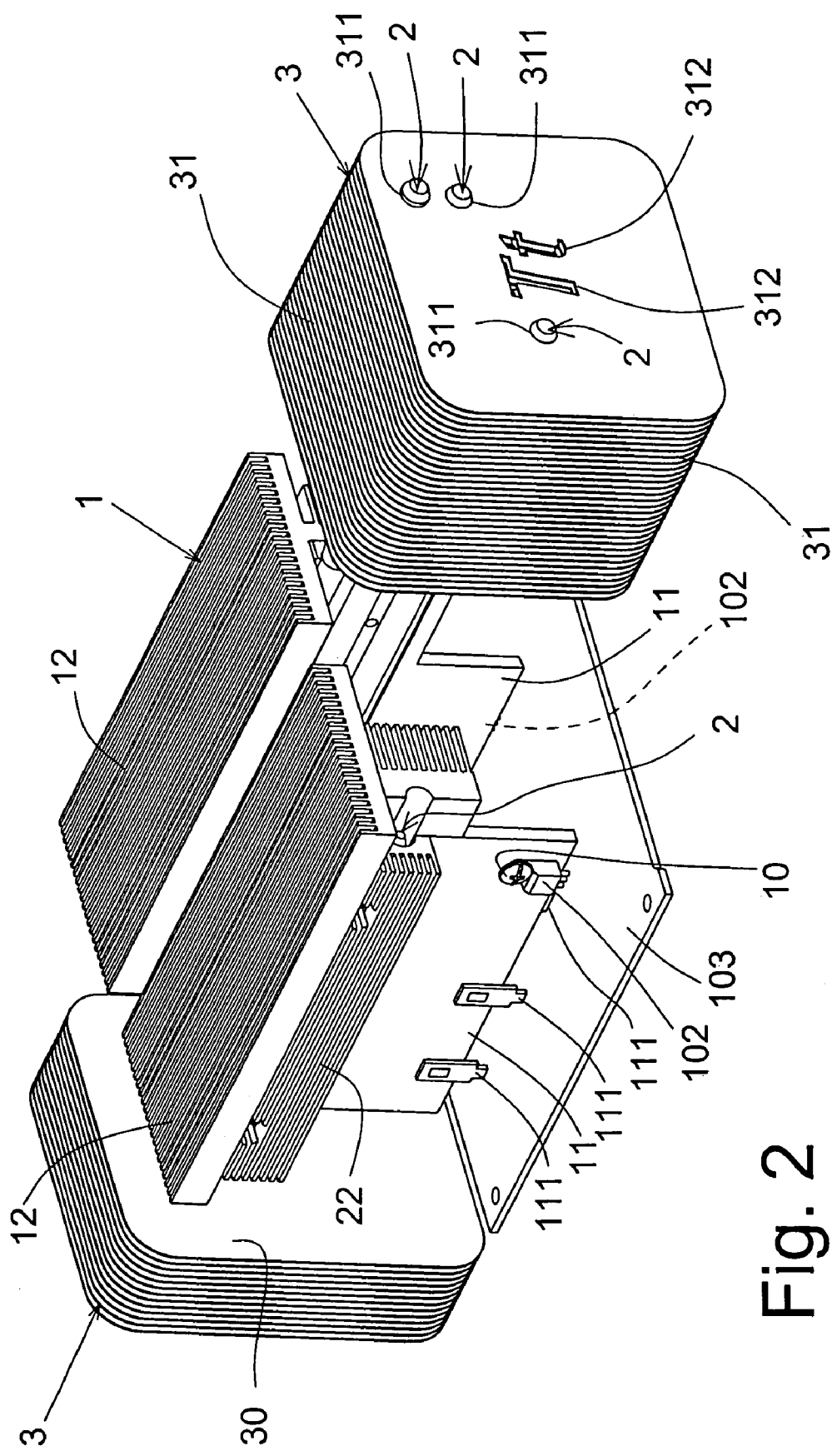
FIG. 2 is a perspective view showing that the heat conductive boards of the present invention are connected on the heat source.

Referring to FIGS. 1 and 2, the heat conductive board 1 of the heat-radiating device of the present invention includes a board body section 11. Multiple projecting contact pins 111 are disposed on an edge of the board body section 11 for fixedly connecting with a circuit board 103 or another part of the power supply. One side of the board body section 11 is correspondingly attached to the heat source 102 of the power supply. The board body section 11 is formed with a fixing hole 112 and the heat source 102 is formed with a through hole 102a aligned with the fixing hole 112. Accordingly, a screw 10 is passed through the through hole 102a and screwed into the fixing hole 112 of the heat conductive board 1 to tightly fixedly attach the heat source 102 to the board body section 11 of the heat conductive board 1.

The heat conductive board 1 further includes a fin section 12 connected on the board body section 11 for enhancing the heat-radiating effect of the heat conductive board 1.

The heat duct 2 of the present invention is made of copper or other material of high heat conductivity. Referring to FIGS. 1 to 4, the duct body 21 of the heat duct 2 is tightly attached to and bridged over a connecting seat 22. The connecting seat 22 is correspondingly locked on one side of the heat conductive board 1. Accordingly, the heat generated by the heat source 102 can be quickly conducted through the heat conductive board 1 and the heat duct 2 to the fins 31 of the fin body 3.

The duct body 21 of the heat duct 2 can be tightly fixed on the connecting seat 22 by way of welding. Alternatively, the duct body 21 of the heat duct 2 can be positioned between a connecting seat 22 and the heat conductive board 1. By means of screws, the connecting seat 22 and the heat conductive board 1 are tightened toward each other to tightly clamp the heat duct 2.

Referring to FIGS. 1 and 2, the inner side 30 of the fin body 3 is tightly connected with the connecting seat 22 of the heat duct 2. Accordingly, the connecting seat 22 supports the fin body 3 on outer side of the housing 101 of the power supply.

The heat-radiating device of the present invention includes multiple heat conductive boards 1 respectively fixedly connected in the housing 101 of the power supply. Each heat conductive board 1 is tightly attached to one heat source 102 of the power supply. The heat-radiating device further includes multiple heat ducts 2. Each heat duct 2 is tightly bridged over a corresponding heat conductive board 1. One end of the heat duct 2 outward protrudes from the housing 101 of the power supply. The heat-radiating device further includes multiple fin bodies 3 each of which is composed of multiple fins 31. The fin bodies 3 are mounted on outer side of the housing 101 of the power supply. The fins 31 of the fin body 3 are respectively formed with corresponding fitting holes 311 through which the heat duct 2 is fitted to contact with the fins 31. Accordingly, the heat generated by the heat source 102 of the power supply is quickly conducted through the heat ducts 2 to the fin bodies 3 on outer side of the housing 101 and dissipated from the fin bodies 3 to the environment.

The heat source 102 of the power supply is a metal oxide semiconductor (MOS) inlaid in the circuit board 103 of the power supply. However, the present invention is applicable to other heat source of the power supply without limitation.

In application of the heat-radiating device of the present invention, the heat generated by the heat source 102 is not only conducted to the heat conductive boards 1 to dissipate, but also is quickly conducted through the heat ducts 2 to the fins 31 of the fin bodies 3 on outer side of the housing 101 of the power supply so as to quickly dissipate to the ambience. Therefore, the heat-radiating efficiency of the heat source is enhanced and the heat is prevented from being lastingly conserved in the housing 101 of the power supply.

Figure 4:
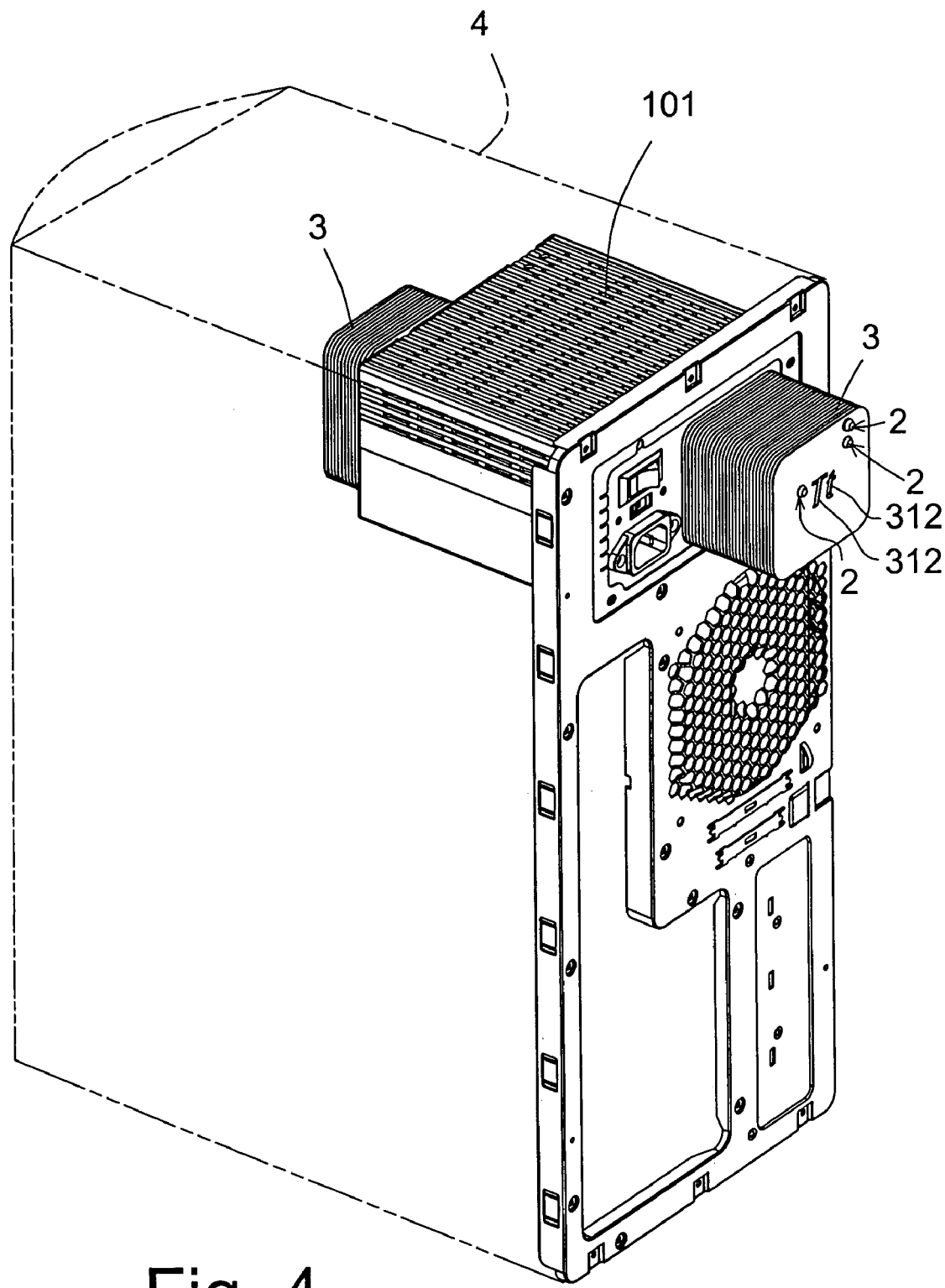
FIG. 4 is a perspective view showing that the present invention is mounted on a computer mainframe casing.
Figure 5:
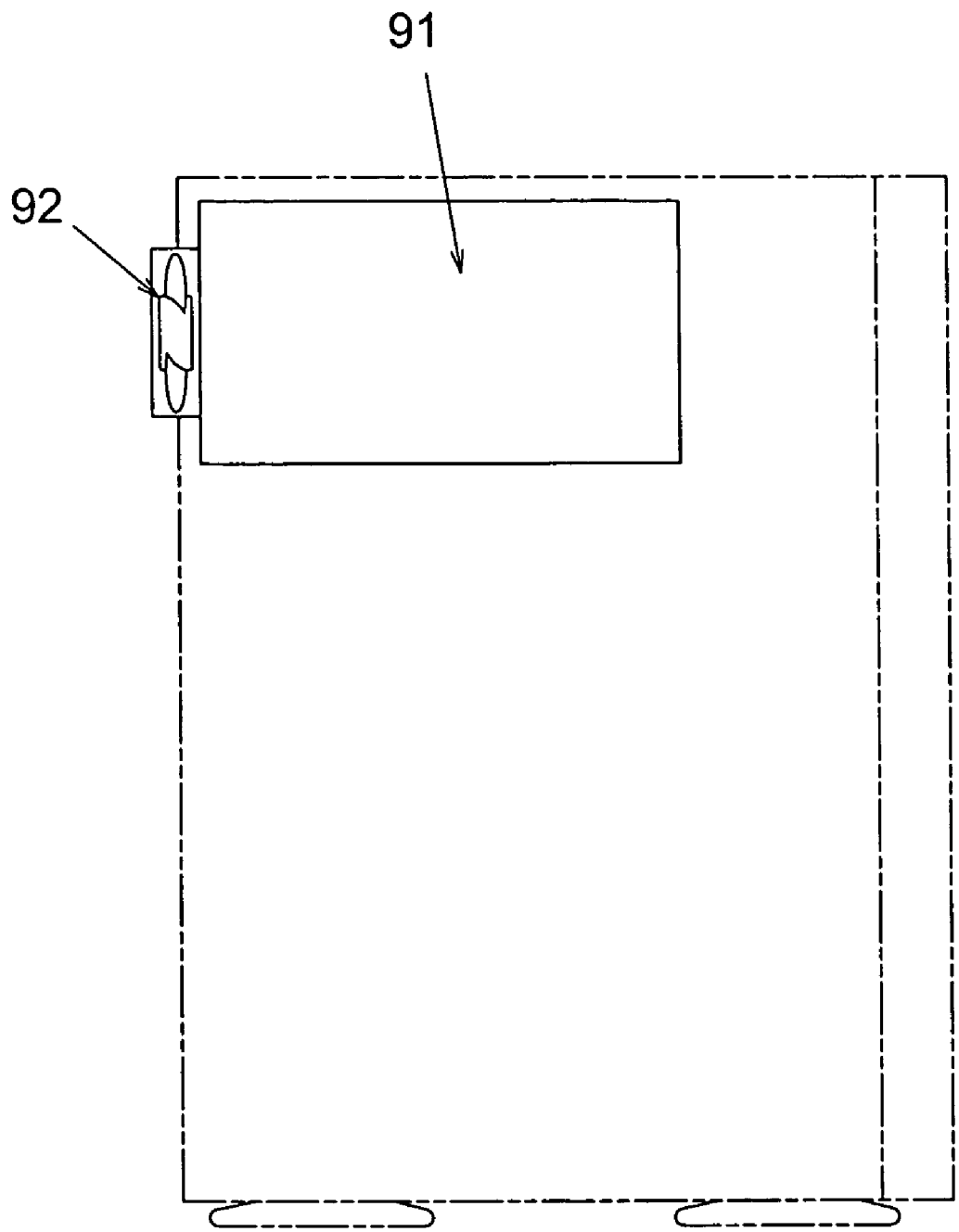
FIG. 5 shows that a conventional power supply is mounted on a computer mainframe casing.

Referring to FIG. 4, when installed, the housing 101 of the power supply is mounted in the casing 4 of a computer mainframe. One of the fin bodies 3 outward protrudes from the casing 4 and is exposed to outer side for better heat-exchange between the interior of the casing 4 and the ambient cool air. Therefore, the heat-radiating effect can be enhanced.

Figure 3:
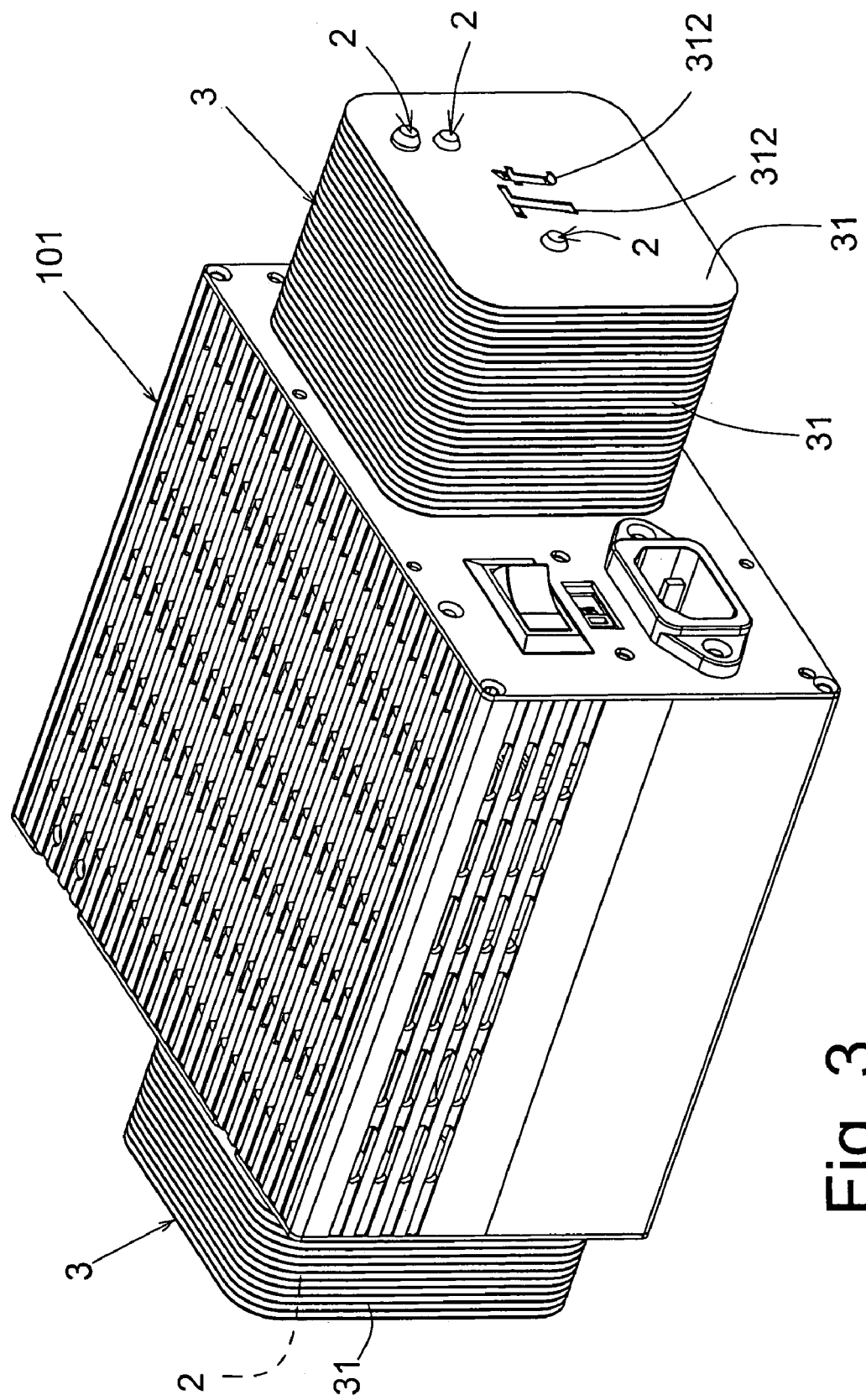
FIG. 3 is a perspective view of the power supply of the present invention.

Referring to FIGS. 1, 2 and 3, the fin body 3 is formed with through holes 312 through which the cool air can flow through the fin body 3 to enhance the heat-radiating effect. The through holes 312 can have various shapes such as the shape of a trademark, character, picture, etc.

The above embodiments are only used to illustrate the present invention, not intended to limit the scope thereof. Many modifications of the above embodiments can be made without departing from the spirit of the present invention.

What is claimed is:

1. A heat duct-equipped heat-radiating device for power supply, comprising:
   (a) a heat conductive board having a boar body section fixedly connected in a housing of the power supply and tightly attached to a heat source of the power supply;
   (b) a heat duct tightly bridged over the board body section of the heat conductive board, one end of the heat duct protruding outwardly from the housing of the power supply, the heat duct having a duct body tightly attached to and bridged over a connecting seat, the connecting seat being correspondingly locked on the heat conductive board; and
   (c) a fin body composed of multiple fins, the fin body being fixedly mounted on outer side of the housing of the power supply, the fins of the fin body being respectively formed with corresponding fitting holes through which the heat duct is fitted to contact with the fins, whereby the heat generated by the heat source of the power supply is quickly conducted through the heat duct to the fin body on outer side of the housing and dissipated from the fin body to outer side.

2. The heat duct-equipped heat-radiating device for power supply as claimed in claim 1, wherein multiple projecting contact pins are disposed on an edge of the board body section of the heat conductive board for fixedly connecting with a circuit board of the power supply, one side of the board body section being correspondingly attached to a heat source of the circuit board.

3. The heat duct-equipped heat-radiating device for power supply as claimed in claim 1, wherein the board body section of the heat conductive board is formed with fixing holes and the heat source is formed with through holes aligned with the fixing holes, whereby screws are passed through the through holes of the heat source and screwed into the fixing holes of the heat conductive board to tightly attach the heat source to the board body section of the heat conductive board.

4. The heat duct-equipped heat-radiating device for power supply as claimed in claim 1, wherein the heat conductive board further includes a fin section connected on the board body section.

5. The heat duct-equipped heat-radiating device for power supply as claimed in claim 1, wherein the duct body of the heat duct is tightly fixed on the connecting seat by way of welding.

6. The heat duct-equipped heat-radiating device for power supply as claimed in claim 1, wherein an inner side of the fin body is tightly connected with the connecting seat of the heat duct, whereby the connecting seat supports the fin body on outer side of the housing of the power supply.

7. A heat duct-equipped heat-radiating device for power supply, comprising:
   (a) a heat conductive board having a boar body section fixedly connected in a housing of the power supply and tightly attached to a heat source of the power supply;
   (b) a heat duct tightly bridged over the board body section of the heat conductive board, one end of the heat duct protruding outwardly from the housing of the power supply, the heat duct having a duct body positioned between a connecting seat and the heat conductive board, whereby by means of screws, the connecting seat and the heat conductive board are tightened toward each other to tightly clamp the heat duct.

* * * * *